United States Patent [19]

Cathey, Jr.

[11] Patent Number: 5,024,722
[45] Date of Patent: Jun. 18, 1991

[54] PROCESS FOR FABRICATING CONDUCTORS USED FOR INTEGRATED CIRCUIT CONNECTIONS AND THE LIKE

[75] Inventor: David A. Cathey, Jr., Boise, Id.

[73] Assignee: Micron Technology, Inc., Boise, Id.

[21] Appl. No.: 536,733

[22] Filed: Jun. 12, 1990

[51] Int. Cl.$^5$ .................. B44C 1/22; C23F 1/02; H01L 21/306

[52] U.S. Cl. .................. 156/643; 156/646; 156/656; 156/659.1; 156/664; 156/665; 204/192.35; 252/79.1; 428/209; 437/187; 437/245; 437/228

[58] Field of Search ............ 156/643, 646, 656, 659.1, 156/664, 665; 204/192.32, 192.35; 437/187, 228, 245; 252/79.1; 428/601, 209

[56] References Cited

U.S. PATENT DOCUMENTS

| | | | |
|---|---|---|---|
| 4,521,275 | 6/1985 | Purdes | 156/643 |
| 4,579,623 | 4/1986 | Suzuki et al. | 156/656 X |
| 4,713,141 | 12/1987 | Tsang | 156/656 X |
| 4,919,748 | 4/1990 | Bredbenner | 156/643 |
| 4,948,462 | 8/1990 | Rossen | 156/643 |

*Primary Examiner*—William A. Powell
*Attorney, Agent, or Firm*—William J. Bethurum

[57] ABSTRACT

A process for defining conductors on a integrated circuit substrate which includes selectively dry etching through a metal layer on the substrate using plasma reactants including conductor sidewall passivation gases such as silicon tetrabromide, SiBr$_4$. This process is useful to form high quality silicon and nitrogen containing inorganic films on the sidewall surfaces of the conductors thus formed, and these films protect the conductors from lateral etching and undercutting and preserve their structural integrity. In a preferred embodiment of the invention, the metal layer or substrate is tungsten, W, and is masked directly with a photoresist polymer.

7 Claims, 1 Drawing Sheet

PROCESS FOR FABRICATING CONDUCTORS USED FOR INTEGRATED CIRCUIT CONNECTIONS AND THE LIKE

TECHNICAL FIELD

This invention relates generally to the fabrication of small geometry electrical conductors for integrated circuits and more particularly to such processes for improving the structural integrity of such conductors while simultaneously increasing process yields and reducing production costs.

BACKGROUND ART

In the field of high density integrated circuit (IC) construction, it becomes necessary to photolithographically define electrical conductors having a very small cross section and a high structural strength and integrity in order to maximize the packing density of interconnected devices which may be constructed in an integrated circuit chip. In the past, these processes have involved various ways to etch or cut through a metal layer such as tungsten or aluminum deposited on top of a thin film substrate so as to define individual conductive strips of metal used to interconnect devices on an integrated circuit chip.

One prior art process used for this purpose involves first developing a dielectric etch mask such as silicon nitride, $Si_3N_4$, to expose predefined areas of an underlying metal substrate and then using a plasma etchant to etch through the exposed portions of the metal substrate to thereby define individual conductive strips therein. Plasma etchers and etching systems and related chemical reactions employed by these systems are generally well known in the semiconductor processing arts and are described, for example, in my copending application Ser. No. 07/536,732 entitled "Method and Apparatus Useful In The Plasma Etching of Semiconductor Materials", filed June 12, 1990, assigned to the present assignee and incorporated herein by reference.

A significant disadvantage of using the above $Si_3N_4$ process relates to the large number of processing steps required in order to ultimately define the individual conductive strips of metal. That is, it is first required to deposit a layer of silicon nitride on the metal substrate and then develop a photoresist mask thereon. Then, it is required to etch through areas of the silicon nitride layer exposed by the photoresist mask in order to define the geometry of the dielectric silicon nitride etch mask. Then the photoresist mask remaining on the dielectric $Si_3N_4$ layer has to be removed therefrom before etching the exposed areas of the underlying metal substrate to define the individual conductive strips therein. Obviously, the requirement for this large number of individual semiconductor processing steps reduces achievable process yields and makes the process relatively expensive and complicated.

In an attempt to provide a process alternative which would eliminate some of the above prior art processing steps, it has been proposed to deposit only a photoresist mask directly on the metal substrate and thereby eliminate altogether the above intermediate dielectric mask layer formation. However, unacceptable lateral etching will occur if a wet etching system is used in combination with a photoresist mask formed directly on a metal substrate. Therefore, dry etchers must be used for this purpose, and in the past plasma dry etching systems have been used in combination with a photoresist mask formed directly on a metal substrate. This alternative process can result in significant anisotropic etching of the metallic substrate exposed by the photoresist mask. In addition, this plasma etching process has been made practical by changing from an etch having little resist selectivity to an etch having a greater resist selectivity and therefore more suitable to preventing unacceptable attack of the photoresist mask and undercutting beneath the photoresist mask.

Whereas the use of the above plasma etching process in combination with a metal substrate masked directly with a polymer such as photoresist has significant advantages over the previously used silicon nitride type of hard masking for both wet and dry etching systems, there is nevertheless still an undesirable amount of attack of the photoresist mask by the dry etchant chemicals used as well as lateral etching and undercutting beneath the photoresist mask during this dry etching process. This lateral etching takes place during the plasma etching process despite the fundamental anisotropic etching nature of the plasma etching process. This anisotropic etching means, among other things, that the etch rate in the vertical or "Y" dimension into the etched material is significantly greater than the etch rate in the lateral or "X" dimension, thereby producing generally V-shaped grooves in the etched material.

The above characteristics of undesirable resist attack, lateral etching, and undercutting in these prior art plasma etching systems produces mesa shaped areas in the plasma etched metal underlayer having non-uniform sidewalls. These metal sidewalls are sometimes etched and tapered in an inwardly direction beneath the flat tops of metal mesas which are protected by the photoresist mask. This resist attack, lateral etching or undercutting during the plasma etching process reduces the structural integrity of the individual metal conductors thus formed. This in turn makes it difficult to provide even and uniform step coverage over these conductors when they are formed on the surface of an integrated circuit and are there protected by glass passivation or other surface protective layers. This metal sidewall attack also makes it difficult to construct conductors having good consistent cross-sectional areas required for good and uniform electrical conduction.

In an effort to reduce the above undesirable lateral etching and undercutting of the conductor sidewalls during plasma etching to form aluminum conductors, silicon tetrachloride, $SiCl_4$, has been added to the plasma reactants to thereby produce and deposit a silicon containing dielectric material on the side walls of aluminum conductors being formed and during the anisotropic plasma etching process. This aluminum sidewall protective layer in turn produces a retardation of the above undesirable horizontal or lateral etching and thereby reduces undercutting of the aluminum islands or aluminum conductors thus formed. However, the use of this latter process employing silicon tetrachloride as the silicon-containing material to form a sidewall inorganic layer for aluminum has not proven entirely satisfactory inasmuch as the deposition rate of the dielectric material formed on the aluminum side walls is too slow. Furthermore, the thin inorganic film produced by this $SiCl_4$ process has not been sufficient in thickness and density to in fact prevent all of the above undesirable horizontal or lateral etching of the aluminum sidewalls during the conductor forming process as previously described.

In the art of dry etching tungsten layers masked directly with a photoresist mask to form individual conductors of tungsten, W, prior art processes have used either SF$_6$, NF$_3$, or Cl$_2$—O$_2$ as the active etchant gas. This gas is introduced into the plasma reaction chamber in order to actively etch the tungsten, and as a byproduct it forms films of tungsten oxides and chlorides on the sidewalls of thus formed tungsten conductors. However, this prior art process often does not yield good high quality protective films of tungsten chloride with acceptable profiles. In addition, the chlorine gas, Cl$_2$, has poor resist selectivity characteristics and undesirably attacks the photoresist etch mask on the surface of the tungsten. In fact, when chlorine gas, Cl$_2$, is used as the active reactant and etchant gas in the dry etching process, it is normally reactived with oxygen in the reaction chamber. This produces an oxygen attack on a resist mask and thus makes it impossible to use a resist mask in this process. Instead, the use of a hard mask such as silicon nitride is required.

There is yet another prior art process which has been used to form sidewall passivation films during the plasma etching of metal layers to form conductive strips therefrom. This prior art process uses fluorocarbon polymers or chlorocarbon polymers in the reaction chamber to in turn to produce organic films rather than inorganic films as the sidewall passivation layer on the thus formed conductive layers. Suitable polymers for this purpose are tetrafluoromethane, chloroform, and methylchloride. However, these polymers have been found to be carcinogenic and, in addition, produce a great deal of undesirable and unacceptable deposition of organic materials in the gas reaction chamber. These materials have to be manually cleaned with much difficulty after each wafer processing and etching operation of the type described herein.

DISCLOSURE OF INVENTION

The general purpose and principal object of the present invention is to provide a novel alternative approach and process with respect to: (1) the above prior art process of using silicon tetrachloride as the sidewall dielectric forming compound for aluminum (2) the above prior art process of forming tungsten chloride as the sidewall inorganic compound for the conductors of tungsten, and (3) the above prior art of forming organic films from polymers as the sidewall protective layers for etched metal conductors.

The present process involves, among other things, the use of silicon tetrabromide, SiBr$_4$, as a sidewall passivation additive to the plasma etching process, with the advantage that improved high quality silicon containing inorganic layers are produced on the sidewalls of the metal substrate being etched. This approach in turn produces individual metal conductors on an underlying substrate in which the structural integrity and strength is greatly increased, thereby enabling improved passivation and step coverage to be formed on and over the individual conductors defined in an integrated circuit construction process.

The process according to the present invention includes the steps of: depositing an etch mask on the surface of a selected metal substrate and then plasma etching exposed surfaces of the metal substrate while using the sidewall passivation additive silicon tetrabromide, SiBr$_4$, to form protected strips of metal from the metal substrate. This is accomplished by depositing a silicon containing inorganic compound on the surfaces of the sidewalls of the etched metal conductors during the plasma etching thereof in order to prevent horizontal etching and lateral undercutting of these conductors.

The process according to the present invention also includes within its scope a process for forming sidewall passivation films on conductors being etched in any dry etching type of environment and comprises the steps of depositing a polymer resist mask on a conductive substrate and accelerating ions into bombardment with areas of the conductive substrate exposed by the resist mask. This ion acceleration is carried out in the presence of both a reactive etchant material-removing gas and a sidewall passivation additive gas. The sidewall passivation additive gas may be selected from the group consisting of silicon tetrabromide, silicon tetrachloride, and silicon tetrafluoride. If, for example, tungsten is the etched material, the reactive etchant materials-removing gas may be selected from the group consisting of sulfur hexafluoride, nitrogen trifluoride, and carbon tetrafluoride. If aluminum or an aluminum alloy is the conductor being etched, the reactive etchant materials-removing gas may be selected from the group consisting of chlorine, hydrogen chloride, and carbon tetrachloride.

The process according to the present invention also includes within its scope the steps of depositing a resist mask on a conductive substrate, and accelerating ions into bombardment with exposed areas of the substrate and in the presence of any suitable chemical reaction which is operative to form a silicon and nitrogen containing sidewall passivating film on the surfaces of the conductors being etched.

In a preferred embodiment of the invention, the metal substrate is tungsten, the etch mask is photoresist which is photolithographically defined to expose selected areas of the tungsten substrate, and the preferred sidewall passivation gas is silicon tetrabromide, SiBr$_4$. The present invention is also directed to a product made by using the process defined above employing a combination of a tungsten substrate, a photoresist mask disposed directly thereon, and a plasma etching process therefor which uses silicon tetrabromide, SiBr$_4$, as an additive and silicon-containing compound useful to form inorganic silicon-containing protective layers on exposed etched walls of the tungsten substrate.

In yet another embodiment of this invention, the novel claimed process combination is directed to the use of a selected one of a group of several halogenated silicon gaseous compounds with the metal tungsten which is covered with a suitable etch mask. The etch mask may be either an inorganic dielectric material or an organic polymer material.

Various other advantages, objects, and features of this invention will become more readily apparent in the following description of the accompanying drawing.

DETAILED DESCRIPTION OF THE PREFERRED EMBODIMENT

Figure 1:
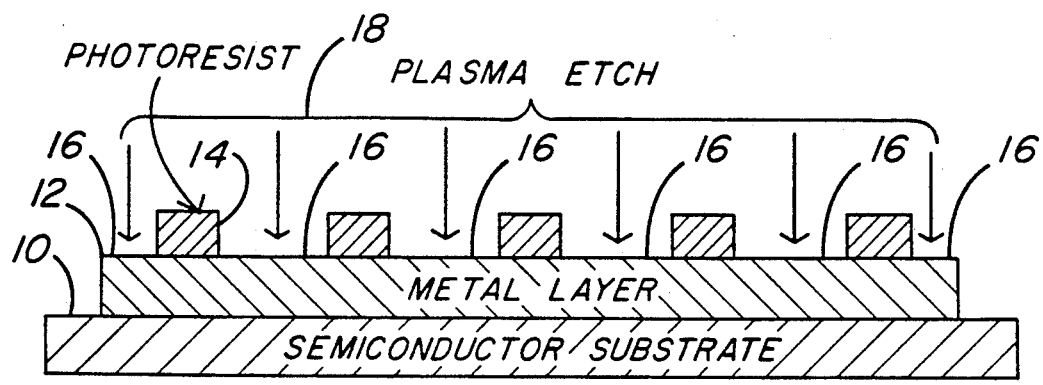
FIGS. 1, 2, and 3 are schematic cross-sectional diagrams to illustrate the various steps a preferred process embodiment of the invention.
Figure 2:
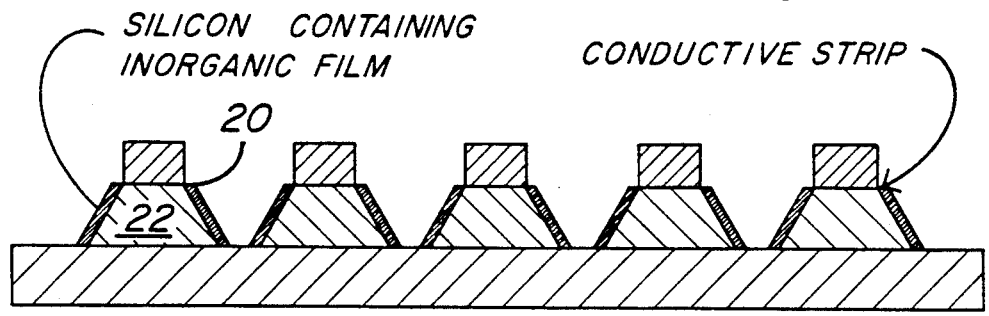
Figure 3:
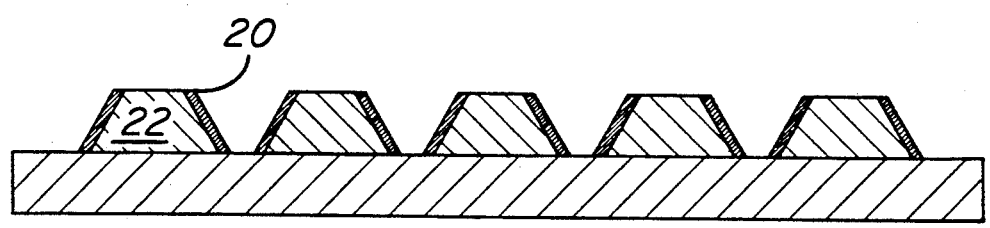

Referring now in succession to FIGS. 1, 2, and 3, FIG. 1 shows a semiconductor substrate 10 upon which a metal layer 12 has been deposited using conventional metal evaporation, sputtering or chemical vapor deposition (CVD) techniques. The substrate 10 is shown in schematic cross-section only and is intended to include a large number of different types of monolithic or thin film substrates which may be processed by the integrated circuit manufacturer. These substrates require the formation of a metal layer 12 thereon useful in the formation of individual conductors for making electrical interconnections to devices and components previously formed within the semiconductor substrate 10.

Figure 4:
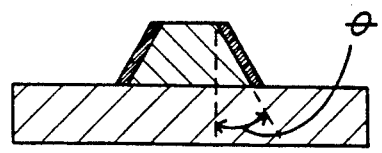
FIG. 4 serves to identify the angle $\Theta$ of the slant of the etched sidewalls of the conductive strips. This angle $\Theta$ may be controlled by varying gas ratios or gas flow rates during the process described herein.

In accordance with the present invention, an etch mask 14 such as photoresist is photolithographically defined as shown on the upper surface of the metal layer 12 and is used to define the surface areas 16 and underlying regions of the metal layer 12 which are to etched away using a plasma etching process of the type described in more detail below. The composite structure shown in FIG. 1 is then transferred to a plasma etching reaction chamber of the type described in my above-identified copending application Ser. No. 07/536,732, and the reactant ion species generated in this reaction chamber are directionally accelerated together with associated gaseous compounds in the chamber which are also identified below. These reactant ion species are accelerated in the direction of the arrows 18 in FIG. 1 to produce anisotropic etching of the metal layer 12 and thereby provide the generally V-shaped grooves therein as indicated in FIG. 2. The exact angle Θ of the metal sidewalls as indicated in FIG. 4 can be controlled between the completely vertical to approximately 20° away from either side of vertical by adjusting, for example, the $SiBr_4/NH_3$ to reactant etchant gas ratio or the oxidant gas flow rates, or both.

During this plasma etching operation, for example, the silicon tetrabromide, $SiBr_4$, gaseous compound may be introduced into the plasma reaction chamber to thereby produce thin layers of an inorganic silicon containing material 20 on the sidewalls of the thus formed metal mesa-shaped conductors 22 as indicated in FIG. 2. During this operation and further as one specific reaction example given herein, the $SiBr_4$ may be reacted with ammonia, $NH_3$ to form silicon nitride, $Si_3N_4$, layers 20. Alternatively, the $SiBr_4$ may be reacted with oxygen, $O_2$, $H_2O$ or $N_2O$, to form silicon dioxide, $SiO_2$. Silicon dioxide will be formed in accordance with the following expression:

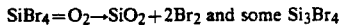

$$SiBr_4 = O_2 \rightarrow SiO_2 + 2Br_2 \text{ and some } Si_3Br_4$$

In FIG. 3, the photoresist etch mask 14 is shown removed from the top surfaces of the metal conductors 22, such as tungsten, thereby leaving the mesa shaped conductors of generally trapezoidal cross-section and without any lateral etching or undercutting or these conductors. Thus, the protective inorganic films 20 in FIG. 3 additionally provide sidewall protection for the conductors 22 after integrated circuit construction has been completed and for the useful life of such circuit.

Using a plasma reaction chamber of the type, for example, described in my above identified copending application Ser. No. 07/536,732 filed June 12, 1990, the composite semiconductor-metal-photoresist structure shown in FIG. 1 may be mounted on the lower backside cooled electrode therein. Here the exposed surfaces 16 are bombarded with ions which are generated in a known manner in the reaction chamber and etched in the presence of an active etchant gas. During this process, there will be introduced a feed gas into the plasma reaction chamber which is comprised of the combination of a carrier gas, such as argon of helium, a reactant etchant materials-removing gas, and a sidewall passivation additive gas. This feed gas is introduced into the reaction chamber at a controlled flow rate and with a known etchant gas-to-sidewall passivation additive gas ratio.

The ions accelerated in the reaction chamber and into bombardment with the exposed areas 16 of the metal substrate 12 pass vertically downward and serve to provide only a vertical removal of the metal substrate material. The reactive materials-removing gas used for either the aluminum removal or tungsten removal process serve not only to remove portions of the metal substrate is a vertical direction, but this gas will also have a tendency to produce an undesirable sidewall erosion beneath the photoresist mask 14. Thus, the sidewall passivation additive gas is listed herein to prevent this erosion, and the ratio of the etchant gas-to-the sidewall passivation gas will control the degree of the angle with respect to vertical that the sidewalls of the metal conductors are contoured. If the ratio of the sidewall passivation additive gas to the etchant gas is increased, the anisotropy of the etching process will be likewise increased. That is, the slant of the metal sidewalls will be contoured in the general shape shown in FIG. 3.

If, however, there is too much etchant gas relative to sidewall passivation gas in the process, the etchant gas will tend to swing the angle of etch back to vertical and even past vertical in extreme cases and underneath the photoresist mask. This of course is undesirable as previously indicated and may be prevented from occurring herein by the proper control of these gas ratios. As described in my above copending application, the reactive materials removing gases, carbon tetrafluoride, $CF_4$, and silicon hexaflouride, $SF_6$, are also used in the reaction chamber and are broken down therein to form the ions which are accelerated into bombardment with the exposed surface area 16 of the metal layer 12. This reaction thereby produces radicals which chemically attack areas 16 of the metal layer 12.

If aluminum conductors are being formed, the etchant gas may be either chlorine, $Cl_2$, hydrogen chloride, HCl, or carbon tetrachloride, $CCl_4$. If tungsten layers are being etched to form the thin conductors therefrom, the etchant gas may be either sulfur hexafluoride $SF_6$, nitrogen trifluoride, $NF_3$, carbon tetrafluoride, $CF_4$. The preferable carrier gas for both the aluminum and tungsten etching processes is argon.

As for the passivation chemistry useful in forming the inorganic sidewall layers, the gases silicon tetrafluoride, silicon tetrachloride, and silicon tetrabromide may be individually used either alone or in combination with nitrous oxide, $N_2O$, in a predetermined ratio. Alternatively, silicon tetrafluoride, silicon tetrachloride, and silicon tetrabromide may be all individually used in specified gaseous ratios with ammonia, $NH_3$, or with water, $H_2O$, or with oxygen, $O_2$.

Using the above passivation chemistry, the etch mask may be formed of either silicon dioxide, $SiO_2$, silicon nitride, $Si_3N_4$, or photoresist. These mask types may be individually used on any one of the metals of tungsten, titanium tungsten, aluminum and aluminum alloys, silicon titanium, or tantalum. However, for reasons previously given, it will most often be preferable to use a photoresist mask rather than a "hard mask" of either silicon nitride or silicon dioxide because of the above elimination of a significant number of process steps required in the etch mask formation process.

EXAMPLE I

If tungsten is to be etched, a specific combination and example of suitable process parameters useful in practicing the present invention would be to pump the plasma reaction chamber down within the range of 75–200 milliTorr and use a flow rate of 20–40 milliliters per minute (ml/m) for sulfur hexaflouride, $SF_6$, a flow rate of 30–60 ml/m for the argon carrier gas, a flow rate of 5–20 ml/m for $SiBr_4$, and a flow rate of 5–20 ml/m for $NH_3$.

EXAMPLE II

If an aluminum-copper alloy is to be etched, a specific combination and example of suitable process parameters useful in practicing the present invention would be to pump the plasma reaction chamber down within the range of 100–250 milliTorr and use a flow rate of 15–35 milliliters per minute (ml/m) for $Cl_2$, an argon flow rate of 20–60 ml/m, an $SiBr_4$ flow rate off 5–20 ml/m and $NH_3$ flow rate of 5–20 ml/m.

The optimum parameter valves within the above ranges have not been given because they have yet to be determined. Accordingly, at the present time the above ranges and values represent the plasma reaction process parameters which define the best mode for practicing this invention.

Various modifications may be made in and to the above described embodiment without departing from the scope of this invention. For example, it may be possible to use the above described process for etching certain semiconductors, such as polycrystalline silicon, instead of only metal and metal alloy layers such as those described above. In addition, other gas reaction processes such as combining dichlorosaline and ammonia to form a silicon and nitrogen containing film may be used as a alternative to the above-identified sidewall film forming processes. However, the use of dichlorosaline with ammonia to form silicon and nitrogen containing films is inherently dangerous in that the materials required are pyrofouric and must be handled with great care. Furthermore, it should also be understood that the process claims herein are in no way limited to the abbreviated and schematic cross section views shown by way of example in the various figures of drawing, and instead may be directed to other and more complicated integrated circuit fabrication methods, such as complex multilevel metal (MLM) IC processes.

Accordingly, these and other materials processing equivalents are within the scope of the following appended claims.

What is claimed is:

1. A process for fabricating metal conductors useful in integrated circuit construction which comprises the steps of:
   a. depositing an etch mask on the surface of a selected metal substrate or layer,
   b. dry etching the surfaces of said metal layer or substrate exposed by said etch mask in the presence of silicon tetrabromide, $SiBr_4$, and simultaneously
   c. depositing a silicon-containing inorganic material on the side walls of metal conductors thus formed in the above etching process to thereby provide sidewall protection of said conductors and retard the horizontal etching or lateral undercutting thereof.

2. The process defined in claim 1 wherein said layer or substrate is tungsten and said etch mask is formed of a photoresist polymer.

3. The process defined in claim 1 wherein said silicon-containing inorganic material contains either silicon dioxide, $SiO_2$, silicon nitride, $Si_3N_4$, or another silicon containing dielectric material.

4. The process defined in claim 3 wherein said metal layer or substrate is tungsten and etch mask is formed of a photoresist polymer.

5. The process defined in claim 1 wherein said inorganic material further contains nitrogen which is supplied by accelerating ions into exposed areas of said substrate in the presence of a reactive etchant materials removing gas and further in the presence of a sidewall passivation additive gas, said sidewall passivation additive gas is selected from the group consisting of silicon tetrafluoride, silicon tetrachloride, and 6. A process for forming sidewall passivation films on the sidewalls of conductors while being etched in a dry etching environment which includes the steps of:
   a. depositing an etch mask on the surface of a conductive substrate, and
   b. forming a nitrogen containing inorganic film on the sidewalls of conductors etched from said substrate while simultaneously accelerating ions into bombardment with areas of said substrate exposed by said etch mask and in the presence of a reactive etchant materials removing gas, and further in the presence of a sidewall passivation additive gas, said sidewall passivation additive gas is selected from the group consisting of silicon tetrafluoride, silicon tetrachloride, and silicon tetrabromide, and said reactive etchant materials removing gas for supplying nitrogen to said inorganic film is selected from the group consisting of ammonia, $NH_3$, and nitrous oxide, $N_2O$.

7. The process defined in claim 6 wherein said etch mask is formed of a polymer resist material directly on the surface of a metal substrate, and said metal substrate is selected from the group of metals consisting of tungsten, titanium-tungsten, aluminum, silicon-titanium, and tantalum.

* * * * *